United States Patent
Lee et al.

(10) Patent No.: US 8,300,467 B2
(45) Date of Patent: Oct. 30, 2012

(54) NONVOLATILE MEMORY DEVICE AND RELATED METHOD OF OPERATION

(75) Inventors: Chul Ho Lee, Suwon-si (KR); Seok Cheon Kwon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 225 days.

(21) Appl. No.: 12/821,341

(22) Filed: Jun. 23, 2010

(65) Prior Publication Data

US 2011/0090740 A1 Apr. 21, 2011

(30) Foreign Application Priority Data

Oct. 21, 2009 (KR) ........................ 10-2009-0100235

(51) Int. Cl.
*G11C 16/04* (2006.01)
(52) U.S. Cl. .............................. 365/185.12; 365/185.18
(58) Field of Classification Search ............. 365/185.03, 365/185.12, 185.18
See application file for complete search history.

(56) References Cited

U.S. PATENT DOCUMENTS

| 7,417,899 B2 | 8/2008 | Lee | |
|---|---|---|---|
| 2004/0085831 A1* | 5/2004 | Cho et al. | 365/200 |
| 2008/0101120 A1* | 5/2008 | Park et al. | 365/185.12 |
| 2010/0091576 A1* | 4/2010 | Kwon et al. | 365/185.25 |

FOREIGN PATENT DOCUMENTS

| JP | 2000228099 A | 8/2000 |
|---|---|---|
| JP | 2001344984 A | 12/2001 |
| KR | 100763114 B1 | 9/2007 |

* cited by examiner

*Primary Examiner* — Anh Phung
(74) *Attorney, Agent, or Firm* — Volentine & Whitt, PLLC

(57) ABSTRACT

A flash memory device comprises alternately arranged odd and even memory cells. The odd and even memory cells are connected to corresponding odd and even bitlines, which are connected to corresponding odd and even page buffers. In a read operation of the flash memory device, data is sensed at two different times via the odd and even bitlines. In certain embodiments, data is read from the odd page buffers while data is being sensed via the even bit lines, or vice versa.

6 Claims, 14 Drawing Sheets

NONVOLATILE MEMORY DEVICE AND RELATED METHOD OF OPERATION

CROSS-REFERENCE TO RELATED APPLICATIONS

This application claims priority under 35 U.S.C. §119 to Korean Patent Application No. 10-2009-0100235 filed on Oct. 21, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile semiconductor memory devices and related methods of operation.

Semiconductor memory devices can be roughly divided into two categories including volatile memory devices and nonvolatile memory devices. Volatile memory devices lose stored data when disconnected from power, and nonvolatile memory devices maintain stored data even when disconnected from power. Examples of volatile memory devices include dynamic random access memory (DRAM) and static random access memory (SRAM), and examples of nonvolatile memory devices include electrically erasable programmable read only memory (EEPROM), ferroelectric random access memory (FRAM), phase change random access memory (PRAM), magnetoresistive random access memory (MRAM), and flash memory.

Because nonvolatile memory devices retain stored data when disconnected from power, they are commonly used to provide long term data storage for electronic devices. For instance, flash memory is commonly used for long term data storage in devices such as solid state drives, cell phones, digital cameras, and personal digital assistants, to name but a few.

A flash memory typically comprises a memory cell array for storing data. The memory cell array typically comprises a plurality of memory blocks each comprising a plurality of pages, and each page comprises a plurality of memory cells sharing a common wordline. A flash memory typically performs erase operations on an entire block unit and performs read and program operations on a page unit. During a read operation, a flash memory temporarily stores a page of data from the memory cell array in a page buffer and then outputs the data from the page buffer. During a program operation, the flash memory receives a page of data, stores the received data in a page buffer, and then programs the stored data in the memory cell array.

SUMMARY

Embodiments of the inventive concept provide flash memory devices, systems, and methods of operation. Certain embodiments provide increased performance by allowing some memory cells to be sensed while previously sensed data is read from page buffers.

According to one embodiment of the inventive concept, a method of operating a flash memory device is provided. The flash memory device comprises first through fourth memory cells arranged in a sequence ordered from the first memory cell to the fourth memory cell and connected to a common wordline, first through fourth bitlines connected to the respective first through fourth memory cells, and first through fourth page buffers connected to the respective first through fourth bitlines. The method comprises sensing data stored in the first and third memory cells and storing the sensed data in the first and third page buffers, and reading the sensed data stored in the first and third page buffers while sensing data stored in the second and fourth memory cells and storing the sensed data in the second and fourth page buffers.

In certain embodiments, the method further comprises simultaneously storing data to be programmed in the first through fourth memory cells in the first through fourth page buffers.

In certain embodiments, the method further comprises simultaneously programming the data stored in the first through fourth page buffers in the first through fourth memory cells.

In certain embodiments, the method further comprises receiving column addresses corresponding to the first and third memory cells prior to sensing the first and third memory cells, and thereafter receiving column addresses corresponding to the second and fourth memory cells prior to sensing the second and fourth memory cells.

In certain embodiments, the flash memory device generates a ready signal while reading the data stored in the first and third page buffers.

In certain embodiments, the flash memory device generates a busy signal while sensing the data stored in the second and fourth memory cells.

According to another embodiment of the inventive concept, a memory system comprises a flash memory device and a memory controller. The flash memory device has an all bitline structure and comprises a memory cell array and a plurality of page buffers configured to temporarily store data read from the memory cell array, the page buffers being arranged as alternating odd page buffers connected to odd bitlines and even page buffers connected to even bitlines. The memory controller is configured to control the flash memory device. The flash memory device is configured to sense data stored in the memory cell array via the odd bitlines connected to the odd page buffers while reading data stored in the even page buffers.

In certain embodiments, the flash memory device performs a program operation by simultaneously transferring data stored in the odd and even page buffers to the memory cell array, and performs a read operation by sensing data via the odd bitlines and the even bitlines at two different times.

In certain embodiments, during a read operation of the flash memory device, the memory controller generates successive column addresses to select the odd bitlines, and subsequently generates successive column addresses to select the even bitlines.

In certain embodiments, during a read operation of the flash memory device, the memory controller generates successive column addresses to select the even bitlines, and subsequently generates successive column addresses to select the odd bitlines.

In certain embodiments, the flash memory device has a first operating mode in which data is sensed simultaneously via the even and odd bitlines, and a second operating mode in which data is sensed via the even and odd bitlines at two different times.

In certain embodiments, selection of the first or second operating mode is based on a read command provided from the memory controller. In certain embodiments, selection of the first or second operating mode is determined by a value stored in a mode register. In certain embodiments, the mode register is incorporated in the memory controller. In certain embodiments, the mode register is incorporated in the flash memory device. In certain embodiments, selection of the first or second operating mode is determined by a fuse.

In certain embodiments, the odd bitlines correspond in number to 4 KB of data and the even bitlines correspond in number to 4 KB of data. In certain embodiments, the flash memory device comprises one or more multi level cells. In certain embodiments, the flash memory device and the memory controller are incorporated in a mobile storage device. In certain embodiments, the flash memory device and the memory controller are incorporated in a solid state drive.

BRIEF DESCRIPTION OF THE DRAWINGS

Embodiments of the inventive concept are described below with reference to the accompanying drawings. In the drawings, like reference numbers denote like features.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

Figure 1:
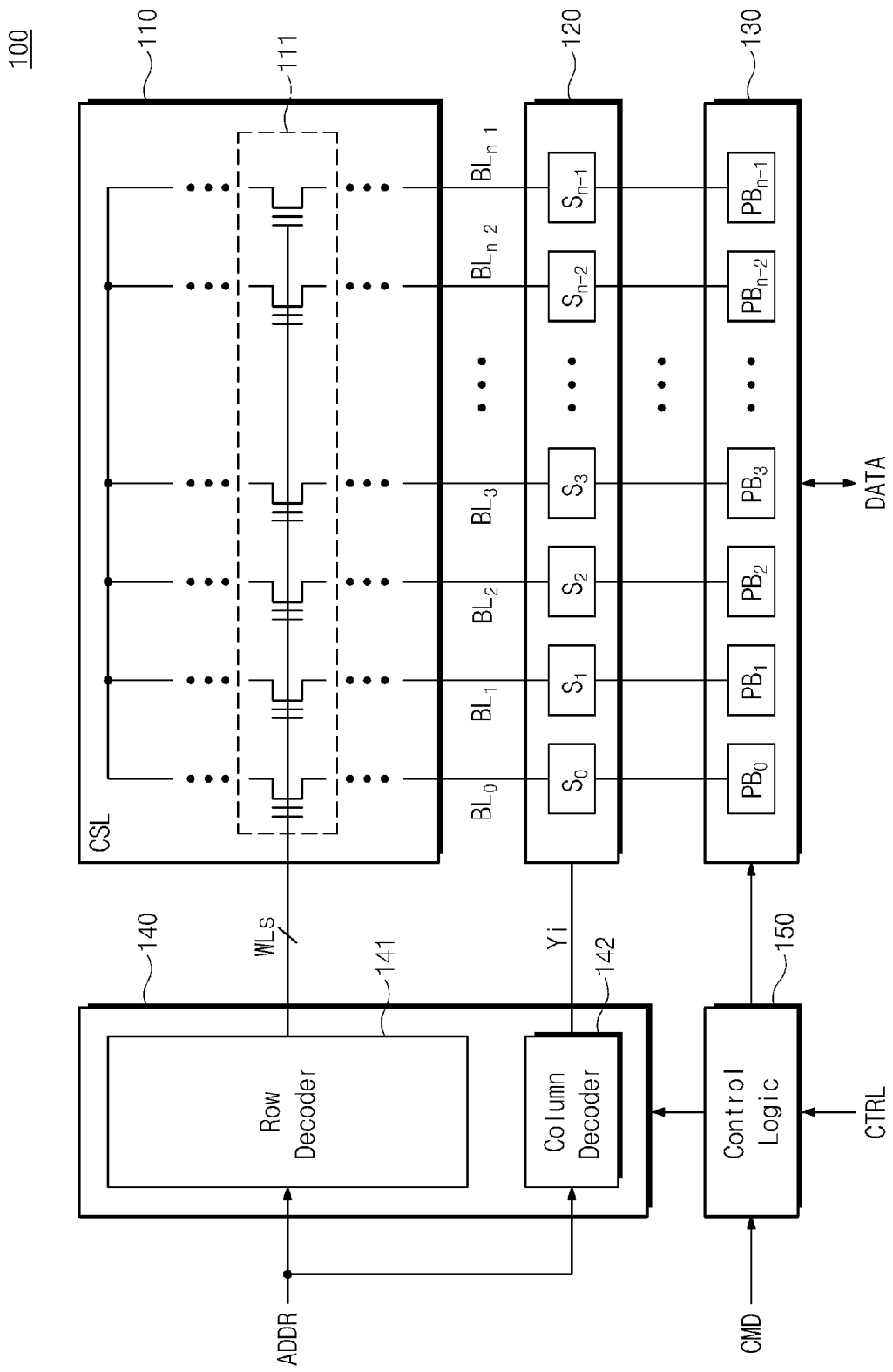
FIG. 1 is a block diagram illustrating a memory device.

FIG. 1 is a block diagram illustrating a flash memory device 100 in accordance with an embodiment of the inventive concept. Referring to FIG. 1, flash memory device 100 comprises a memory cell array 110, a column select circuit 120, a page buffer circuit 130, an address decoder 140 and control logic 150.

Memory cell array 110 comprises a plurality of memory blocks. Each of the memory blocks comprises a plurality of pages, and each page comprises a plurality of memory cells, such as a page 111 shown in FIG. 1. The flash memory performs erase operations in block units and performs read and program operations in page units.

Column select circuit 120 comprises a plurality of switch circuits $S_0$ through $S_{n-1}$. Each of switch circuits $S_0$ through $S_{n-1}$ is connected to memory cell array 110 by a corresponding one of bitlines $BL_0$ through $BL_{n-1}$. Each of switch circuits $S_0$ through $S_{n-1}$ selects one of bitlines $BL_0$ through $BL_{n-1}$ in response to a column select signal Yi.

Page buffer circuit 130 comprises a plurality of page buffers $PB_0$ through $PB_{n-1}$. Each of page buffers $PB_0$ through $PB_{n-1}$ is connected to column select circuit 120 by a corresponding one of bitlines $BL_0$ through $BL_{n-1}$.

In a program operation of flash memory device 100, page buffers $PB_0$ through $PB_{m-1}$ receive data from an external source and temporarily store the data before it is programmed into memory cell array 110. In a read operation of flash memory device 100, page buffers $PB_0$ through $PB_{n-1}$ receive data from memory cell array 110 and temporarily store the data before transmitting it to an external destination.

Address decoder 140 comprises a row decoder 141 and a column decoder 142. Row decoder 141 receives a row address to select a memory block or a page. A row and column address for selecting a memory block is called a block address and a row and column address for selecting a page is called a page address. In the explanation that follows, it is assumed that page 111 is selected. Column decoder 142 receives a column address and generates a column select signal Yi, which is provided to column select circuit 120.

Control logic 150 controls operations for programming, reading and erasing flash memory device 100 in response to a command CMD and a control signal CTRL. For example, in a read operation, control logic 150 controls address decoder 140 to select a wordline and a bitline, and controls page buffer circuit 130 to temporarily store a page of data stored in page buffers $PB_0$ through $PB_{n-1}$.

The performance of flash memory device 100 can be improved through a scheme in which a "large size page" is divided into two "small size pages" to prevent interference between adjacent bitlines. In selected examples below, the large size page comprises all memory cells of the selected page 111 and the two small size pages comprise even numbered memory cells and odd numbered memory cells of the selected page 111, respectively.

To prevent malfunctions from occurring due to interference between adjacent bitlines, flash memory device 100 can perform sensing operations separately on the first small size page via the odd numbered bitlines, and on the second small size page via the even numbered bitlines. In other words, flash memory device 100 can perform sensing via the even numbered bitlines before or after performing sensing via the odd numbered bitlines.

In the embodiment of FIG. 1, although the large size page is divided into two small size pages, flash memory device 100 still uses an all bitline (ABL) scheme in which each bitline is connected to a corresponding page buffer.

Figure 2:
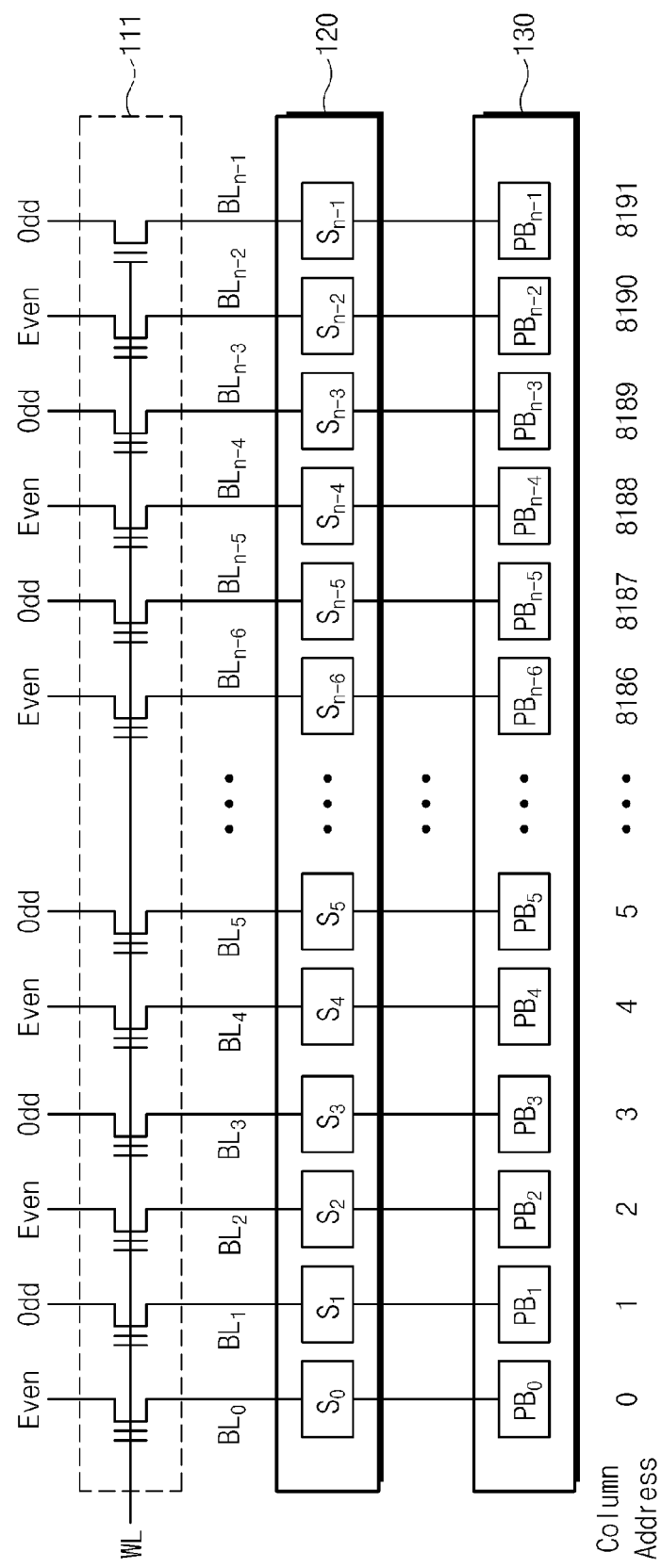
FIG. 2 is a circuit diagram illustrating a column addressing method for a memory device.

FIG. 2 is a circuit diagram illustrating a column addressing method for flash memory device 100. For explanation purposes, it will be assumed that flash memory device 100 has 8192 bit lines (n=8192) each assigned a thirteen bit column address in a range between 0 and 8191. In other words, bitlines $BL_0$ through $BL_{n-1}$ are assigned column addresses ranging from 0 through 8191.

Figure 3:
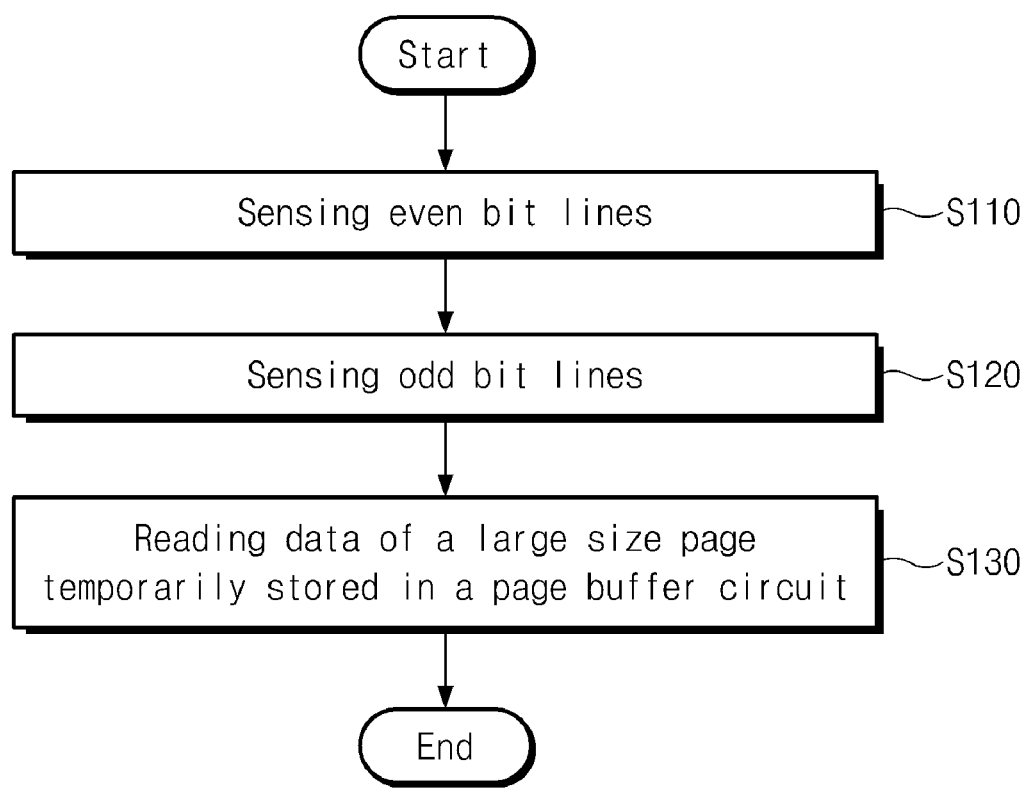
FIG. 3 is a flow chart illustrating a method of reading data in a memory device using the column addressing method of FIG. 2.

FIG. 3 is a flow chart illustrating a method of reading data in flash memory device 100 using the column addressing method of FIG. 2. Referring to FIG. 3, flash memory device 100 senses data from a first small size page of memory cells via even numbered bitlines and stores the data in even numbered page buffers of page buffer circuit 130 (S110). Next, flash memory device 100 senses data from a second small size page of memory cells via odd numbered bitlines and stores the data in odd numbered page buffers of page buffer circuit 130 (S120). Flash memory device 100 then reads the data from the first and second small size pages as a large size page comprising all of the data stored in page buffer circuit 130 (S130).

Individual bits of data in each small size page do not necessarily have continuously numbered column addresses. For example, the first small size page may comprise data in even numbered page buffers with column addresses 0, 2, 4, ..., 8186, 8188, 8190, and the second small size page may comprise data in odd numbered page buffers with column address 1, 3, 5, ..., 8187, 8189, 8191. In certain embodiments, data in a small size pages having discontinuous addresses cannot be read separately from page buffer circuit 130, so flash memory device 100 reads the data from page buffer circuit in a large size page unit. In a read operation of such embodiments, two separate sensing operations are performed through even and odd numbered bitlines to place data in page buffer circuit 130, and the data is then transferred from page buffer circuit 130 in a single operation.

Figure 4:
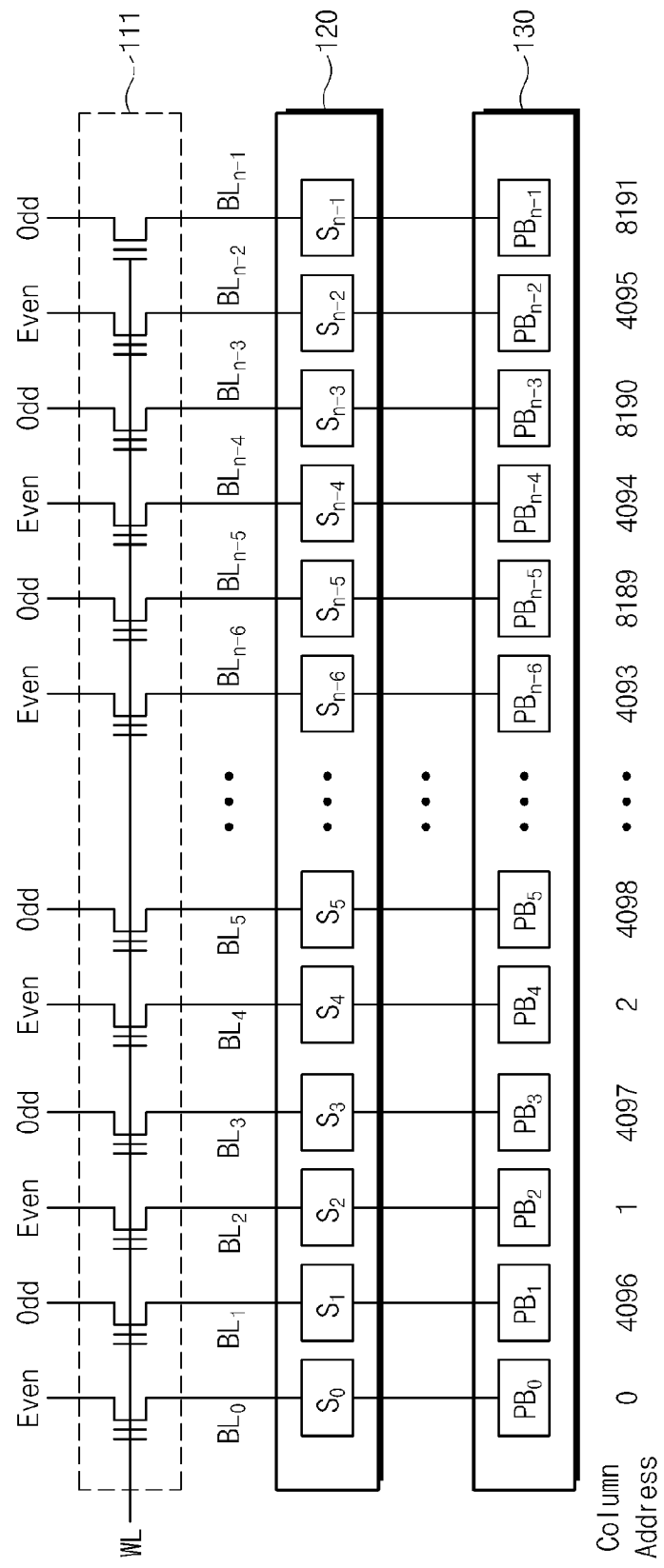
FIG. 4 is a circuit diagram illustrating a column addressing method for a memory device.

FIG. 4 is a circuit diagram illustrating another column addressing method of flash memory device 100. As in the embodiment of FIG. 2, bitlines $BL_0$ through $BL_{n-1}$ are assigned to column addresses 0 through 8191. In the embodiment of FIG. 4, however, the even numbered bit lines are assigned sequential column addresses ranging from 0 through 4095 and the even numbered bitlines are assigned sequential column addresses ranging from 0 through 4096 through 8191.

Figure 5:
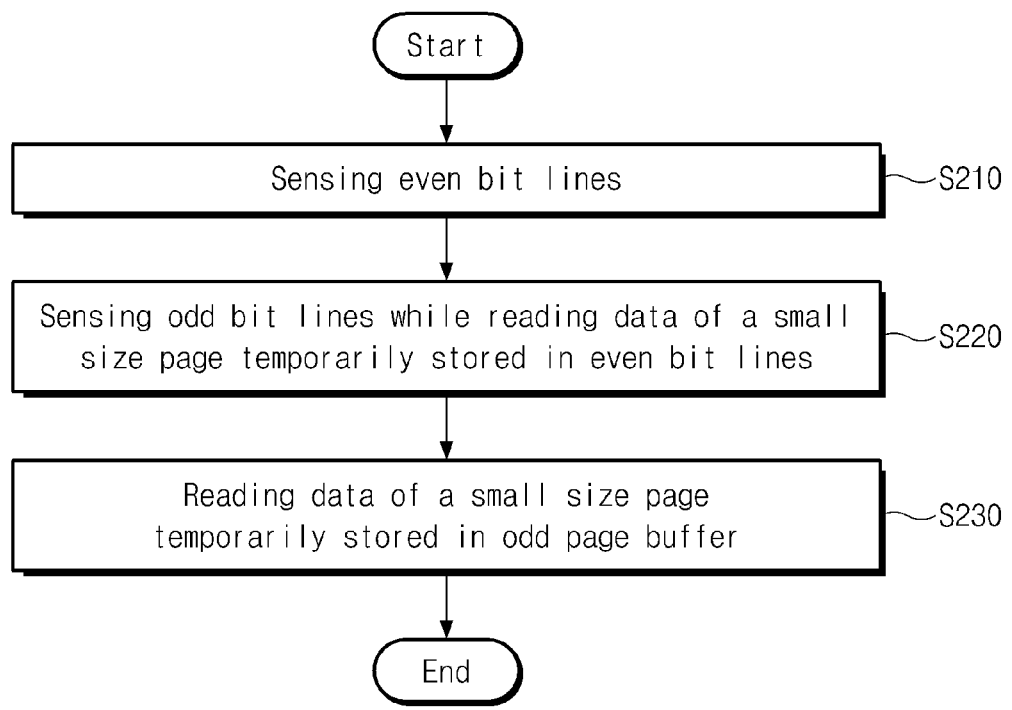
FIG. 5 is a flow chart illustrating a method of reading data in a memory device using the column addressing method of FIG. 4.

FIG. 5 is a flow chart illustrating a method of reading data in a memory device using the column addressing method of FIG. 4. Referring to FIG. 5, flash memory device 100 senses data from a first small size page of memory cells via even numbered bitlines and stores the data in even numbered page buffers of page buffer circuit 130 (S210). Next, flash memory device 100 senses data from a second small size page of memory cells via odd numbered bitlines and stores the data in odd numbered page buffers of page buffer circuit 130 (S220). Flash memory device 100 then reads the data from the first and second small size pages as a large size page comprising all of the data stored in page buffer circuit 130 (S230).

In the embodiment of FIG. 5, bits of data in each small size page have continuously numbered column addresses. For example, data in the first small size page temporarily stored in even numbered page buffers have continuously numbered column addresses 0, 1, 2, ..., 4093, 4094, 4095. Because the data bits in the first small size page have continuous column addresses, they can be read as a separate unit from the second small size page. Similarly, the data bits in the second small size page have continuously numbered column address and can be read as a separate unit from the first small size page. Thus, flash memory device 100 using the column addressing method of FIG. 4 can read data by a small size page unit.

Figure 6:
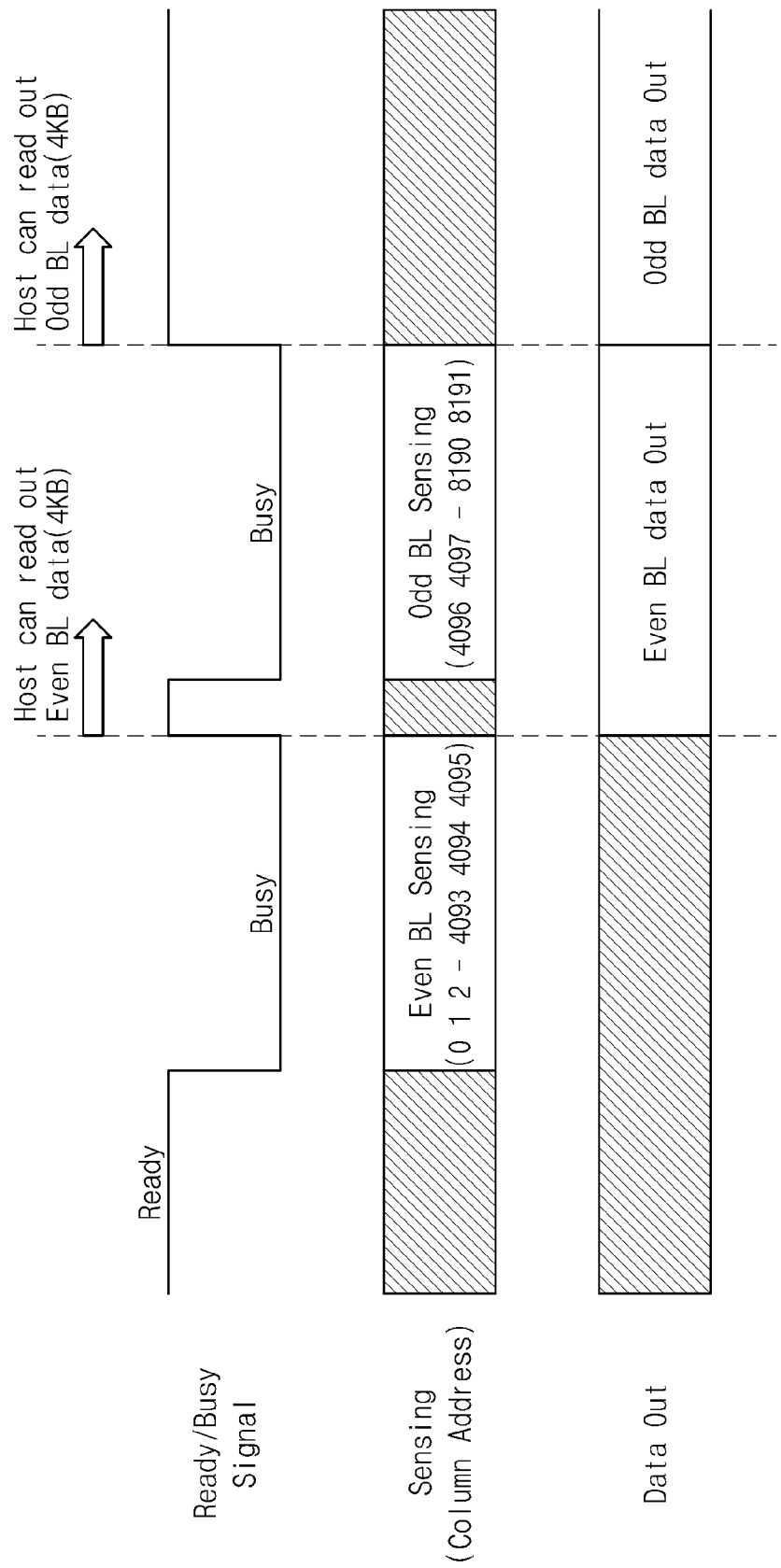
FIG. 6 is a timing diagram illustrating a method of reading data in a memory device using the column addressing method of FIG. 4.

FIG. 6 is a timing diagram illustrating a method of reading data in flash memory device 100 using the column addressing method of FIG. 4. Referring to FIG. 6, flash memory device 100 senses data in a first small size page of memory cells through even numbered bitlines according to a ready/busy signal. Flash memory device 100 begins to sense the data when the ready/busy signal is in a ready state. The ready/busy signal transitions to a busy state while the data is sensed. The data in the first small size page is temporarily stored in even numbered page buffers having a continuously numbered column addresses 0, 1, 2, ..., 4093, 4094, 4095.

After the sensing operation of the first small size page, flash memory device 100 can read the data of the first small size page from the even numbered page buffers according to the ready/busy signal. Flash memory device 100 can also sense data in a second small size page of memory cells via odd numbered bitlines while reading the first small size page from the even numbered page buffers. The second small size page is temporarily stored in odd numbered page buffers with continuously numbered column addresses 4096, 4097, 4098, ..., 8189, 8190, 8191.

Once a sensing operation on the odd numbered bitlines is completed, flash memory device 100 can read a small size page of data temporarily stored in odd numbered page buffers according to the ready/busy signal.

Using the column addressing method of FIGS. 4 through 6, flash memory device 100 can sense odd numbered bitlines while reading data of a first small size page temporarily stored in even numbered page buffers. Accordingly, the time required to perform a sensing operation on odd numbered bitlines can be reduced, and the overall performance of a read operation can be improved.

In alternative embodiments of flash memory device 100, bitlines $BL_0$ through $BL_{n-1}$ can be divided into N bitline groups (N≧2). For instance, in one embodiment, a plurality of bitline groups are defined as follows. A first bitline group comprises bitlines $BL_0$, $BL_{0+N}$, $BL_{0+2N}$, ..., $BL_{n-3N}$, $BL_{n-2N}$, $BL_{n-N}$. A second bitline group comprises bitlines $BL_1$, $BL_{1+N}$, $BL_{1+2N}$, ..., $BL_{n+1-3N}$, $BL_{n+1-2N}$, $BL_{n+1-N}$. A third bitline group comprises bitlines $BL_2$, $BL_{2+N}$, $BL_{2+2N}$, ..., $BL_{n+2-3N}$, $BL_{n+2-2N}$, $BL_{n+2-N}$. A fourth bitline group comprises bitlines $BL_3$, $BL_{3+N}$, $BL_{3+2N}$, ..., $BL_{n+3-3N}$, $BL_{n+3-2N}$, $BL_{n+3-N}$. Fifth through N-th bitline groups can be similarly defined. Thus, an Nth bitline group comprises $BL_{N-1}$, $BL_{2N-1}$, $BL_{3N-1}$, ..., $BL_{n-1-2N}$, $BL_{n-1-N}$, $BL_{n-1}$.

In certain embodiments described below, bitlines $BL_0$ through $BL_{n-1}$ are divided into first through fourth bitline groups, and that page buffers $PB_0$ through $PB_{n-1}$ corresponding to bitlines $BL_0$ through $BL_{n-1}$ are divided into first through fourth page buffer groups. Also in certain embodiments described below, flash memory device 100 provides a first operation mode for reading data with a small size page unit and a second operation mode for reading data in a large size page unit. The first operation mode and the second operation mode can be distinguished by a command (CMD). Each operation mode will be described in further detail with reference to FIGS. 7 and 8.

Figure 7:
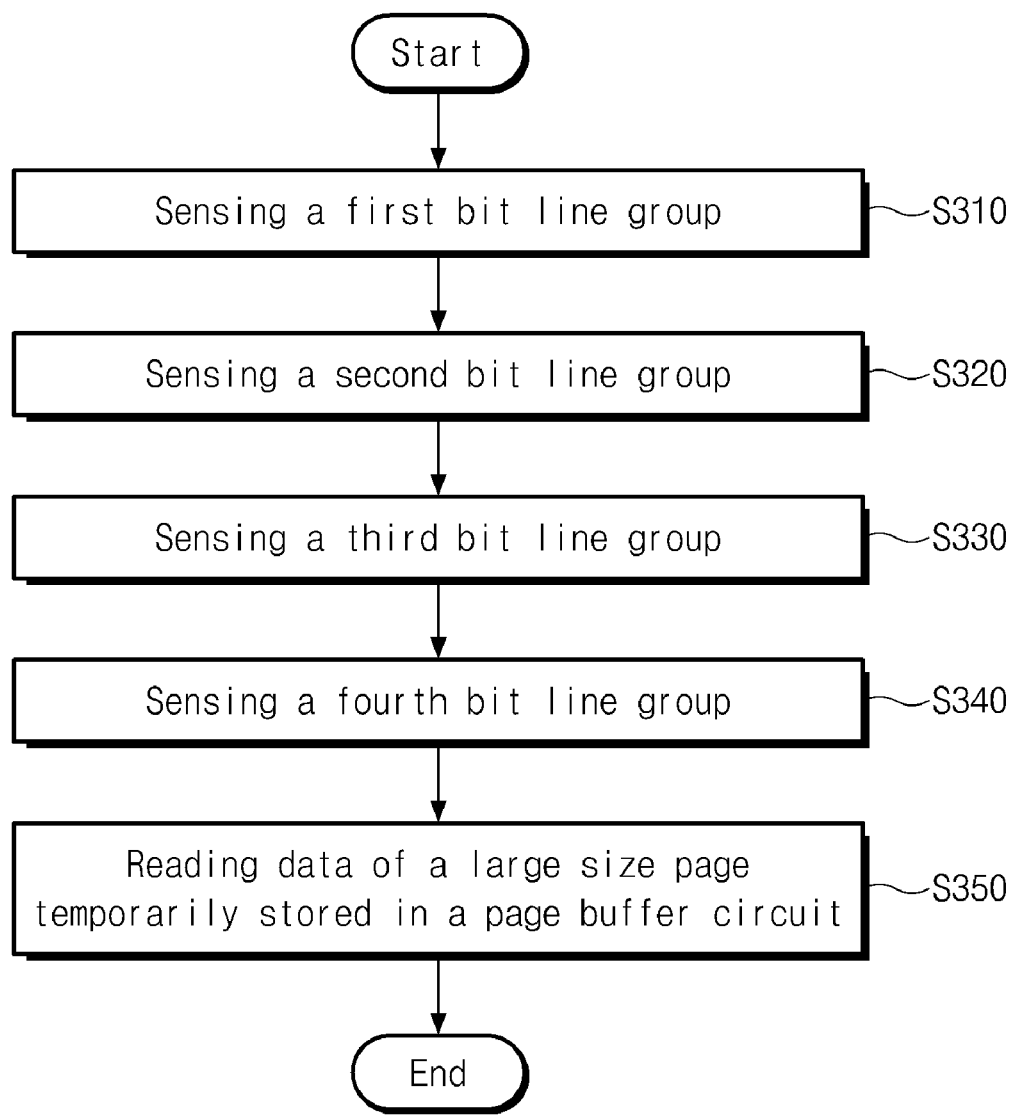
FIG. 7 is a flow chart illustrating a first operation mode of a memory device.

FIG. 7 is a flow chart illustrating a first operation mode of flash memory device 100 in accordance with an embodiment of the inventive concept. Referring to FIG. 7, flash memory device 100 senses a first small size page of data through the first bitline group and stores the first small size page of data in the first page buffer group (S310). Next, flash memory device 100 senses a second small size page of data through the second bitline group and stores the second small size page of data in the second page buffer group (S320). Then, flash memory device 100 senses a third small size page of data through the third bitline group and stores the third small size page of data in the third page buffer group (S330). Thereafter, flash memory device 100 senses a fourth small size page of data through the fourth bitline group and stores the fourth small size page of data in the fourth page buffer group (S340). Finally, flash memory device 100 reads the first through fourth small size pages of data from page buffer circuit 130 as a large size page of data (S350).

Figure 8:
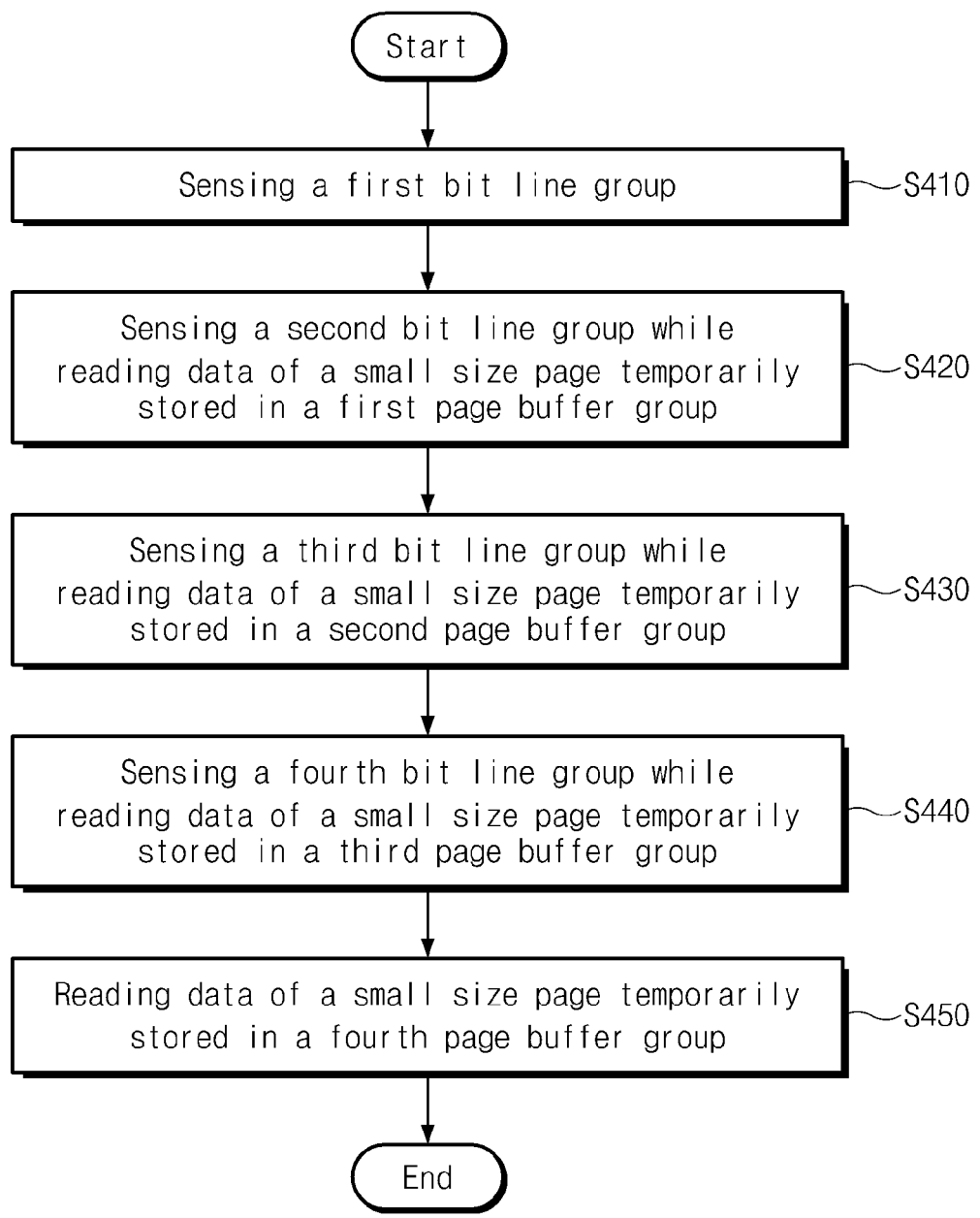
FIG. 8 is a flow chart illustrating a second operation mode of a memory device.

FIG. 8 is a flow chart illustrating a second operation mode of a flash memory device in accordance with an embodiment of the inventive concept. Referring to FIG. 8, flash memory device 100 senses a first small size page of data through the first bitline group and stores the sensed data in the first page buffer group (S410). Then, while reading the first small size page of data out of the first page buffer group, flash memory device 100 senses a second small size page of data through the second bitline group and stores the sensed data in the second page buffer group (S420). Next, flash memory device 100 senses a third small size page of data through the third bitline group and stores the third page buffer group while reading the second small size page of data temporarily stored in the second page buffer group (S430). Thereafter, flash memory device 100 senses a fourth small size page of data through the fourth bitline group and temporarily stores the sensed data in the fourth page buffer group while reading the third small size page temporarily stored in the third page buffer group (S440). Finally, flash memory device 100 reads the fourth small size page of data temporarily stored in the fourth page buffer group (S450).

In the embodiments of FIGS. 7 and 8, flash memory device 100 performs a read operation in first and second operation modes according to a command CMD. In these embodiments, flash memory 100 performs program operations using a single mode where program data is temporarily stored in page buffers $PB_0$ through $PB_{n-1}$ and data stored in page buffers $PB_0$ through $PB_{n-1}$ is simultaneously programmed in flash memory device 100. In other words, read operations are performed using small or large size page units while program operations are performed using large size page units.

In certain embodiments, the size of a large size page is 8 KB and the size of a small size page is 4 KB. Flash memory device 100, however, may be implemented with various sizes of pages.

In various alternative embodiments, flash memory device 100 can store one or more bits per memory cell. A memory cell storing one bit data is called a single level cell (SLC) and a memory cell storing two or more bit data is called a multi level cell (MLC). Where flash memory device 100 comprises multi level cells, each of page buffers $PB_0$ through $PB_{n-1}$ is typically implemented with a structure that can temporarily store two or more bits of data.

Flash memory device 100 can be incorporated in various products. For instance, flash memory device 100 can be implemented in electronic devices such as a personal computers, camcorders, cell phones, personal media players, and personal digital assistants, as well as storage devices such as memory cards, USB memories, and SSDs, to name but a few.

Figure 9:
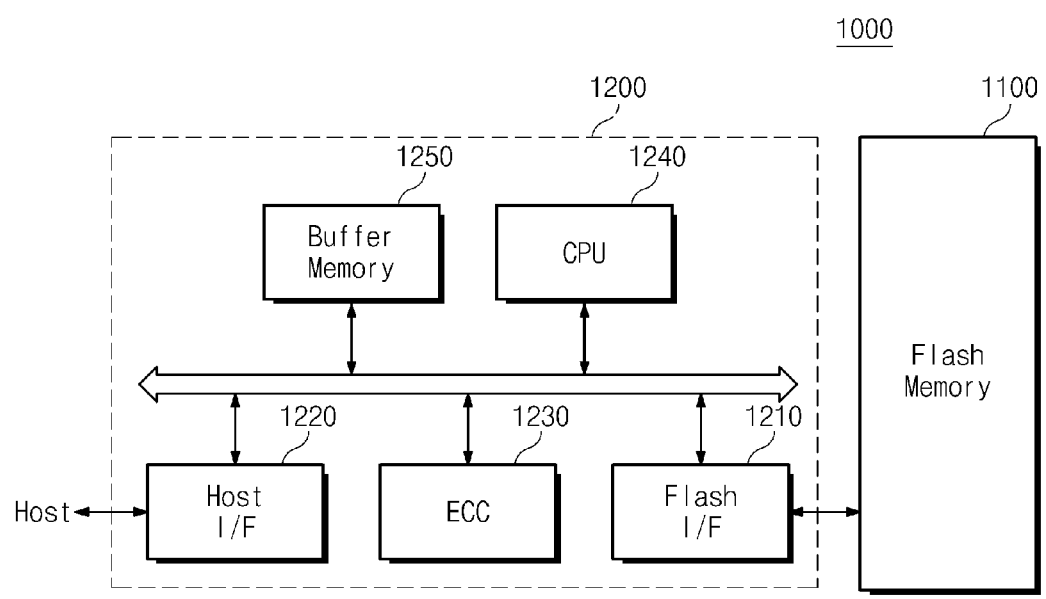
FIG. 9 is a block diagram illustrating a memory system using a flash memory device.

FIG. 9 is a block diagram illustrating a memory system using a flash memory device in accordance with an embodiment of the inventive concept. Referring to FIG. 9, memory system 1000 comprises a flash memory device 1100 and a memory controller 1200.

In certain embodiments, flash memory device 1100 and memory controller 1200 are included in a single storage device. The storage device may comprise, for instance, a mobile storage device such as USB memory or a memory card (e.g., an MMC, SD card, xD card, CF card, or SIM card). Such a storage device can typically be connected to a host such as a computer, a notebook computer, a digital camera, a cell phone, a MP3 player, PMP, or a game console.

Flash memory device 1100 performs erase, program and read operations under the control of memory controller 1200. Memory controller 1200 comprises a flash interface 1210, a host interface 1220, an error correction code (ECC) circuit 1230, a central processing unit 1240 and a buffer memory 1250.

Flash interface 1210 is used to exchange commands, addresses and data with flash memory device 1100. For instance, in a read operation, flash interface 1210 provides a read command and an address to flash memory device 1100. Similarly, in a program operation, flash interface 1210 provides a program command, an address and data to flash memory device 1100. Host interface 1220 receives a program or read request from a host, or provides data to the host in response to a request such as a read request.

ECC circuit 1230 generates a parity bit (or ECC data) based on data being transmitted to flash memory device 1100. The generated parity bit is stored in a spare area of flash memory device 1100. ECC circuit 1230 uses the parity bit to detect any errors in the data when it is subsequently read from flash memory device 1100. Where the detected error is correctable, ECC circuit 1230 corrects the detected error. ECC circuit 1230 may be located inside memory controller 1200 or outside memory controller 1200 according to different configurations of memory system 1000.

Central processing unit 1240 controls a read operation or a program operation of flash memory device 1100 in response to a request from the host. Buffer memory 1250 can temporarily store data read from flash memory device 1100 or data provided from the host. Buffer memory 1250 may also be used to drive firmware such as a flash translation layer (FTL). The FTL is typically managed by central processing unit 1240. Buffer memory 1250 is typically implemented by a volatile memory such as a DRAM or SRAM.

Buffer memory 1250 can store table information for managing read error information. The table information is meta data and is stored in a meta data area of flash memory device 1100 under the control of central processing unit 1240. The table information is copied to buffer memory 1250 from the meta area when memory system 1000 is connected to power. Although not illustrated in the drawings, memory system 1000 typically comprises a ROM for storing information to interface with the host.

Memory system 1000 typically comprises a flash memory device 1100 having an ABL structure and memory controller 1200 to control flash memory device 1100.

Flash memory device 1100 can read memory cells connected to even bitlines while sensing memory cells connected to odd bitlines, and vice versa, similar to certain embodiments of flash memory device 100 described above in relation to FIGS. 1 through 8. Moreover, flash memory device 1100 can perform program and read operations using methods and/or operating modes similar to those described above in relation to FIGS. 1 through 8. In various embodiments, the operating mode of flash memory device 1100 can be determined by a read command, a mode resister or a fuse. The read command is typically provided from memory controller 1200, and the mode resister can be included in flash memory device 1100 or memory controller 1200.

In a read operation, memory controller 1200 typically provides a column address to flash memory device 1100 to select even or odd bitlines after providing a column address to select an odd or even bitlines.

Figure 10:
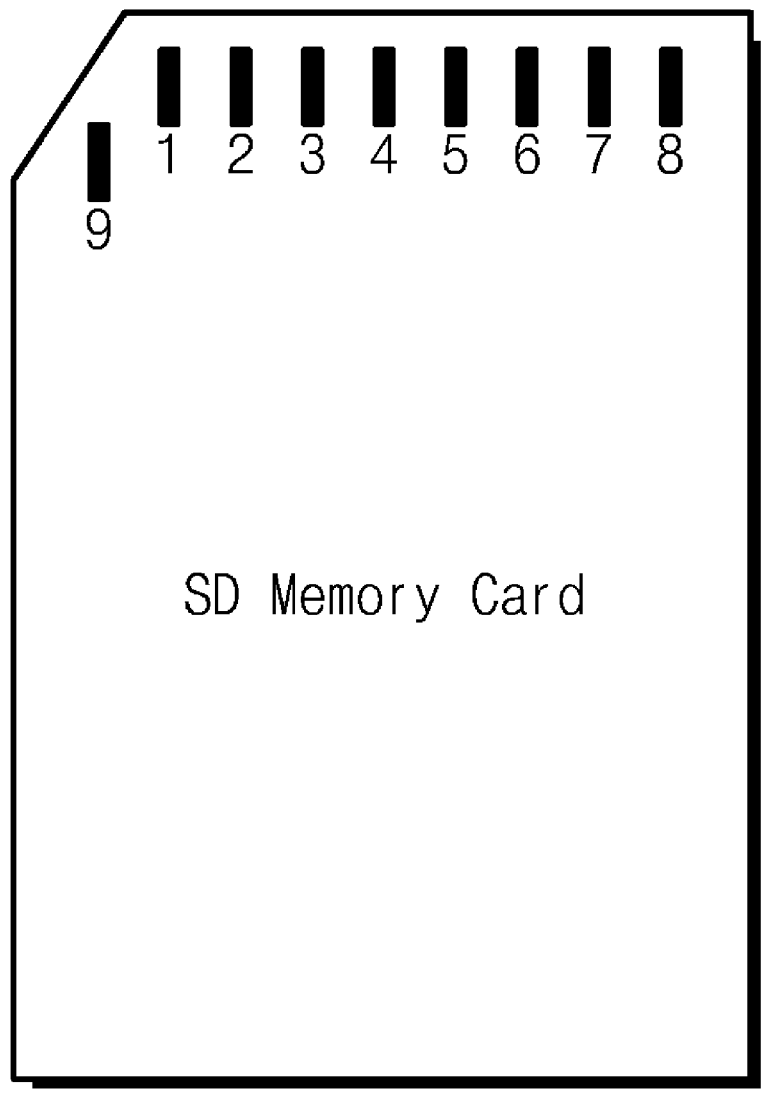
FIG. 10 is a block diagram illustrating a memory card comprising a flash memory device.

FIG. 10 is a block diagram illustrating a memory card incorporating a flash memory device in accordance with an embodiment of the inventive concept. In the embodiment of FIG. 10, the memory card is an SD card having four data pins (e.g., pins 1, 7, 8, 9), one command pin (e.g., 2), one clock pin (e.g., 5) and three power supply pins (e.g., 3, 4, 6).

In this embodiment, command and response signals are transmitted between the flash memory device and a host via the command pin. The command signals are typically transmitted to the flash memory device from the host and the response signals are typically transmitted to the host from the flash memory device.

In certain embodiments, memory system 1000 comprises a mobile storage device such as the SD card of FIG. 10. Memory system 1000 may also comprise flash memory device 1100 having an ABL structure and memory controller 1200 to control flash memory device 1100. Flash memory device 1100 can read memory cells connected to even bitlines while sensing memory cells connected to odd bitlines, and vice versa.

Figure 11:
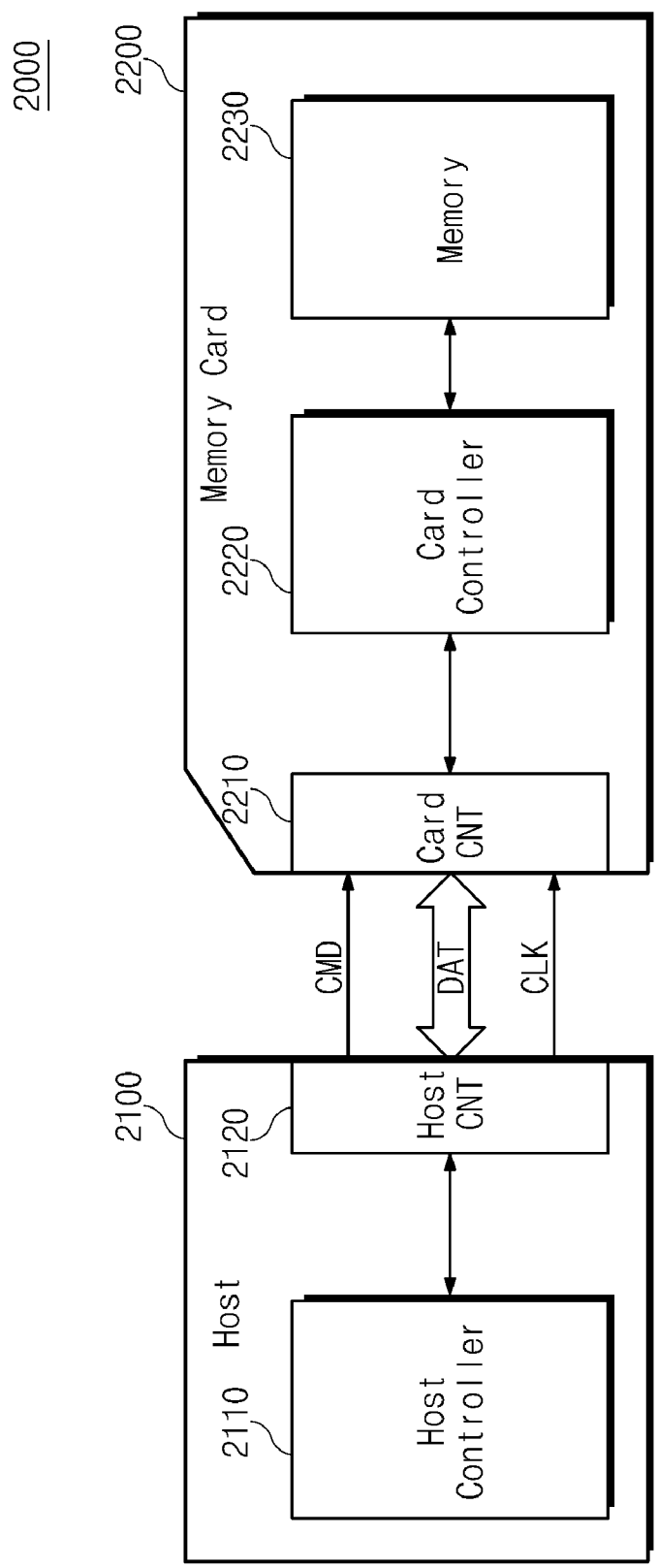
FIG. 11 is a block diagram illustrating an embodiment of the memory card illustrated in FIG. 10 and a connection between the memory card of FIG. 10 and a host.

FIG. 11 is a block diagram illustrating the internal construction of the memory card illustrated in FIG. 10 and a connection between the memory card and a host. Together, the memory card and the host constitute a memory card system 2000.

Referring to FIG. 11, memory card system 2000 comprises a host 2100 and a memory card 2200. Host 2100 comprises a host controller 2110 and a host connection unit 2120. Memory card 2200 comprises a card connection unit 2210, a card controller 2220 and a memory 2230.

Host connection unit 2120 and card connection unit 2210 each comprise a plurality of pins, such as a command pin, a data pin, a clock pin, a power supply pin and so on. The number of pins varies depending on the type of memory card 2200. For instance, an SD card has nine pins, while other types of memory cards may have fewer or more pins. Host 2100 programs data in memory card 2200 and reads data stored in memory card 2200. Host controller 2110 transmits commands, such as program and read commands, a clock signal CLK generated by a clock generator in host 2100, and data, to memory card 2200 via host connection unit 2120.

Card controller 2220 stores data in memory 2230 in response to program commands received via card connection unit 2210 and in synchronization with a clock signal generated by a clock generator. Memory 2230 stores data transmitted from host 2100. For example, if host 2100 is a digital camera, memory 2230 may store image and video data.

In certain embodiments, memory system 1000 can be incorporated in memory card system 2000. As indicated above, memory system 1000 comprises flash memory device 1100 having an ABL structure and memory controller 1200 to control flash memory device 1100. In the embodiment of FIG. 11, memory controller 1200 can be incorporated in card controller 2220 and memory device 1100 may be incorporated in flash memory 2230.

Figure 12:
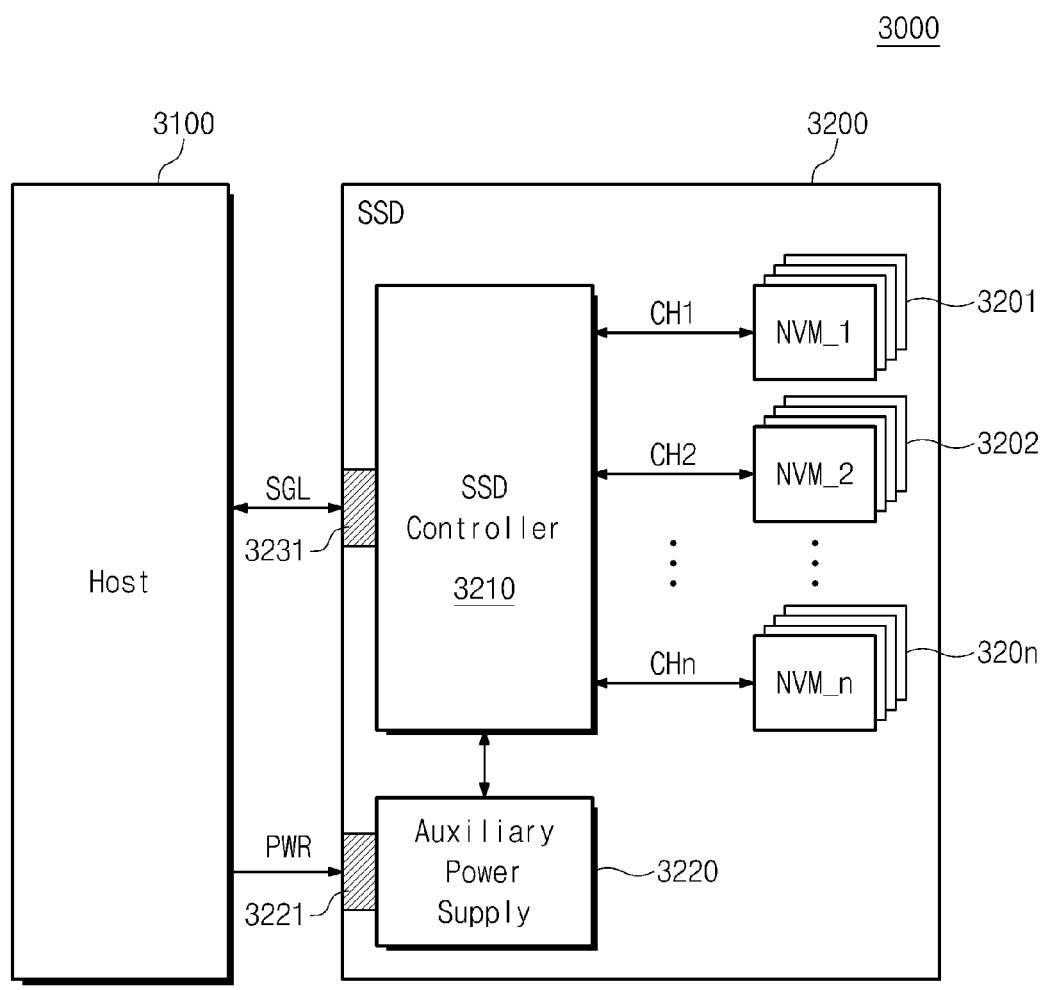
FIG. 12 is a block diagram illustrating a flash memory device in a solid state drive (SSD).

FIG. 12 is a block diagram illustrating an SSD system 3000 comprising a flash memory device in accordance with an embodiment of the inventive concept. Referring to FIG. 12, SSD system 3000 comprises a host 3100 and a SSD 3200. SSD 3200 exchanges signals with host 3100 through a signal connector 3231 and receives power through a power connector 3221. SSD 3200 comprises a plurality of nonvolatile memory devices 3201 through 320n, an SSD controller 3210 and an auxiliary power supply 3220.

Nonvolatile memory devices 3201 through 320n are used as a storage media and can be implemented, for instance, by flash memory devices having large amounts of a storage capacity. SSD 3200 typically stores data using primarily flash memory, but may use other forms of nonvolatile memory, such as PRAM, MRAM, ReRAM, FRAM, or others.

Nonvolatile memory devices 3201 through 320n are connected to SSD controller 3210 via a plurality of channels CH1 through CHn, with each memory device connected to one or more channel. Memory devices connected to one channel may be connected to the same data bus.

SSD controller 3210 exchanges signals SGL with host 3100 via signal connector 3231. Signals SGL typically comprise commands, addresses, or data. SSD controller 3210 programs data in a corresponding memory device or reads data from a corresponding memory device under the command of host 3100. The internal structure of SSD controller 3210 is described in detail with reference to FIG. 13.

Auxiliary power supply 3220 is connected to host 3100 via power connector 3221. Auxiliary power supply 3220 receives power PWR from host 3100 and may charge a super capacitor built into SSD controller 3210. In various embodiments, auxiliary power connector 3220 can be located inside or outside SSD 3200. For example, in certain embodiments, auxiliary power supply 3220 is located on a main board to provide an auxiliary power supply to SSD 3200.

In certain embodiments, memory system 1000 is incorporated in SSD system 3000. As indicated above in relation to FIG. 9, memory system 1000 comprises flash memory device 1100 having an ABL structure and memory controller 1200 to control flash memory device 1100. In certain embodiments, for instance, memory controller 1200 is incorporated in SSD controller 3210 and flash memory device 1100 is incorporated in or implemented by nonvolatile memory devices 3201 through 320n.

Figure 13:
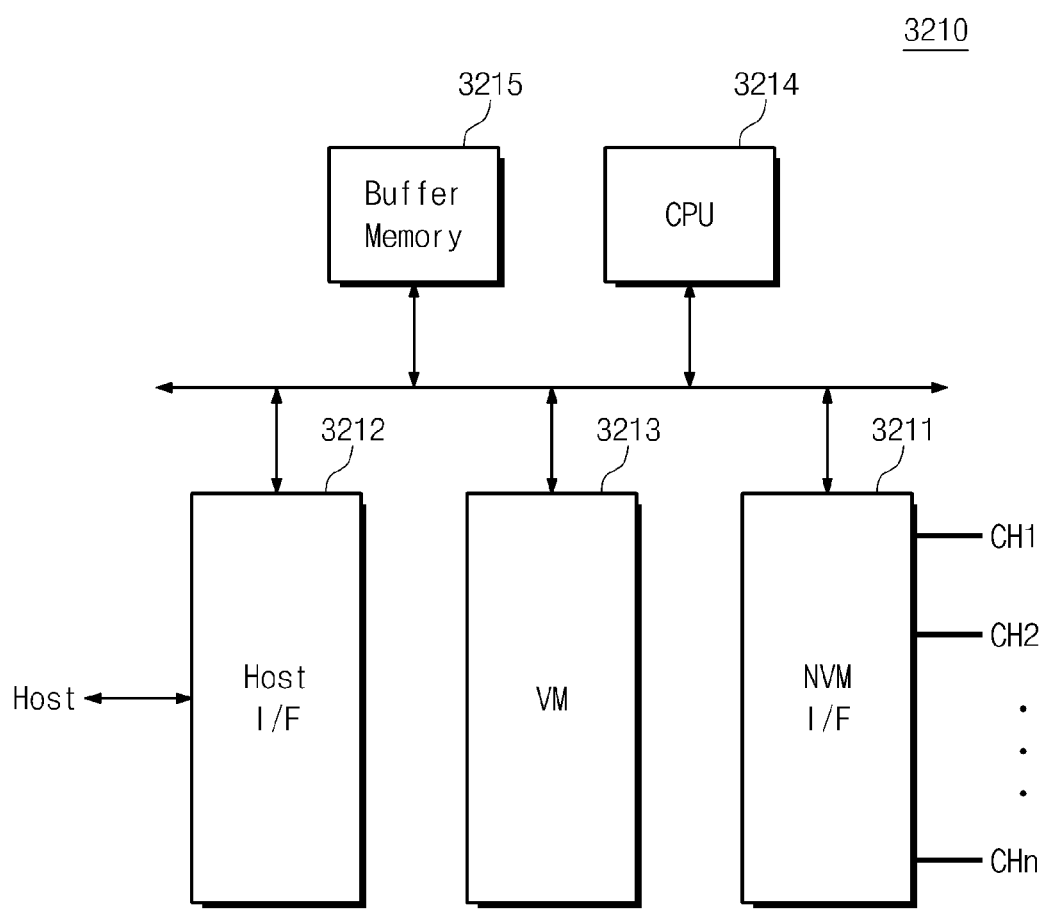
FIG. 13 is a block diagram illustrating an embodiment of the SSD controller in FIG. 12.

FIG. 13 is a block diagram illustrating an embodiment of SSD controller 3210 illustrated in FIG. 12. Referring to FIG. 13, SSD controller 3210 comprises a nonvolatile memory (NVM) interface 3211, a host interface 3212, an ECC circuit 3213, a central processing unit 3214, and a buffer memory 3215.

NVM interface 3211 scatters data transmitted from buffer memory 3215 to each of channels CH1 through CHn. NVM interface 3211 transmits data read from nonvolatile memory devices 3201 through 320n to buffer memory 3215. In this embodiment, NVM interface 3211 operates as a NAND flash memory interface. Accordingly, SSD controller 3210 performs program, read, and erase operations using certain techniques of NAND flash memory interfaces.

Host interface 3212 provides an interface with SSD 3200 using a protocol of host 3100. For instance, in certain embodiments, host interface 3212 can communicate with host 3100 using protocols such as universal serial bus (USB), small computer system interface (SCSI), PCI express, ATA, parallel ATA (PATA), serial ATA (SATA), or serial attached SCSI (SAS). In certain embodiments, host interface 3212 can also perform disk emulation functions so that host 3100 can interact with SSD 3200 as if it were a hard disk drive (HDD).

ECC circuit 3213 generates a parity bit using data transmitted to nonvolatile memory devices 3201 through 320n. The generated parity bit is stored in a spare area of the nonvolatile memory devices 3201 through 320n. ECC circuit 3213 uses the parity bit to detect any errors in data read from the nonvolatile memory devices 3201 through 320n. Where possible, ECC circuit 3213 corrects the detected error.

Central processing unit 3214 analyzes signals SGL received from host 3100, and then processes the analyzed signals. Central processing unit CPU 3214 controls host 3100 or nonvolatile memory devices 3201 through 320n through host interface 3212 or NVM interface 3211. Central processing unit CPU 3214 controls the operation of nonvolatile memory devices 3201 through 320n based on stored firmware to drive SSD 3200.

Buffer memory 3215 temporarily stores program data received from host 3100 or data read from nonvolatile memory devices 3201 through 320n. Buffer memory 3215 can also store mesh data or cache data to be stored in the nonvolatile memory devices 3201 through 320n. Where a sudden power off operation occurs, mesh data or cache data stored in buffer memory 3215 is stored in nonvolatile memory devices 3201 through 320n. Buffer memory 3215 typically comprises a volatile memory such as a DRAM or SRAM.

Memory system 1000 typically comprises flash memory device 1100 having the ABL structure and memory controller 1200 to control flash memory device 1100. In certain embodiments, flash memory device 1100 reads memory cells connected to even bitlines while sensing memory cells connected to odd bitlines and vice versa. Where memory system 1000 is incorporated in SSD system 3000, memory controller 1200 may be incorporated in SSD controller 3210.

Figure 14:
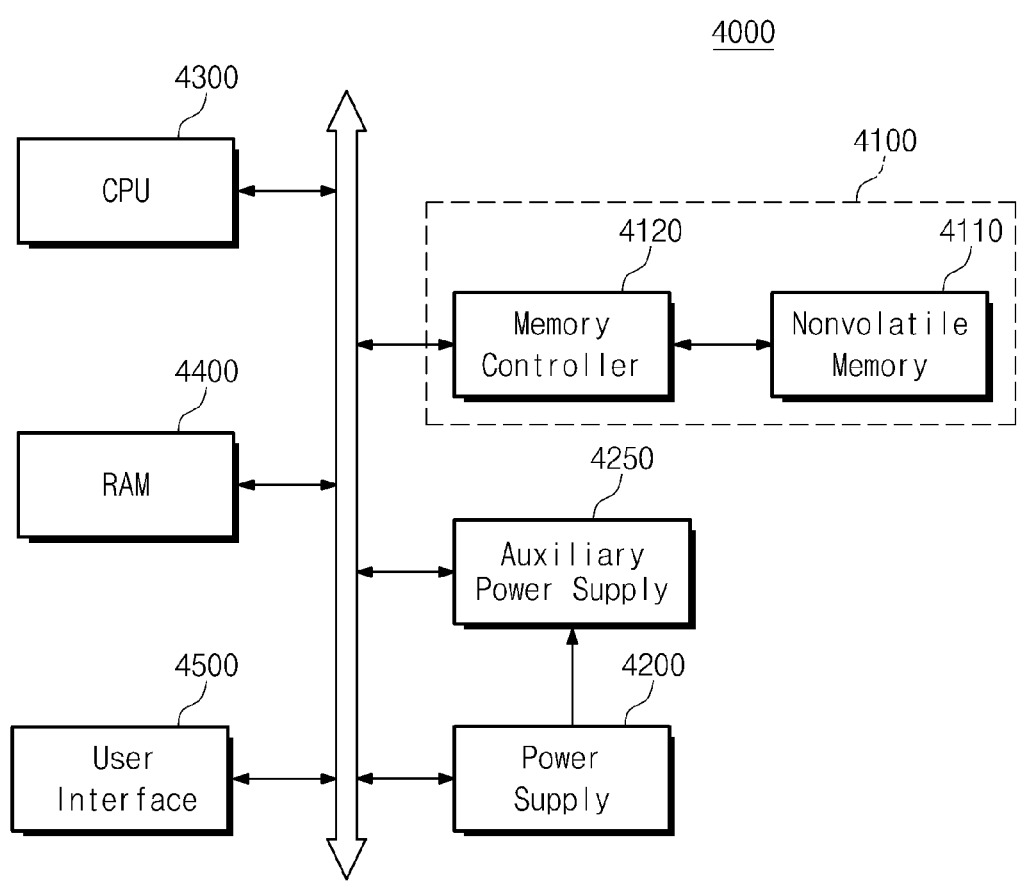
FIG. 14 is a block diagram illustrating an electronic device comprising a flash memory device.

FIG. 14 is a block diagram illustrating an electronic device 4000 incorporating a flash memory device in accordance with an embodiment of the inventive concept. In certain embodiments, the electronic device comprises a personal computer or a mobile electronic device such as a notebook computer, a cell phone, a PDA, or a camera.

Referring to FIG. 14, electronic device 4000 comprises a memory system 4100, a power supply 4200, an auxiliary power supply 4250, a central processing unit 4300, a RAM 4400 and a user interface 4500. Memory system 4100 comprises a flash memory 4110 and a memory controller 4120.

In certain embodiments, memory system 1000 is incorporated in memory system 4100 of electronic device 4000. Memory system 1000 comprises flash memory device 1100 having an ABL structure and memory controller 1200 to control flash memory device 1100. In certain embodiments, flash memory device 1100 reads memory cells connected to even bitlines while sensing memory cells connected to odd bitlines, and vice versa.

In certain embodiments, the ABL structure comprises 8 KB total bitlines and 4 KB each of odd and even bitlines. However, the number of bitlines can be varied in other embodiments. Additionally, in various alternative embodiments, memory system 1000 can be implemented with memory cells storing different numbers of bits, e.g., SLCs, two-bit MLCs, etc.

As indicated above, certain embodiments of the inventive concept provide flash memory devices capable of performing read operations using different sized page units. This capability can improve certain performance characteristics of the flash memory device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of operating a flash memory device comprising first through fourth memory cells arranged in a sequence ordered from the first memory cell to the fourth memory cell and connected to a common wordline, first through fourth bitlines connected to the respective first through fourth memory cells, and first through fourth page buffers connected to the respective first through fourth bitlines, the method comprising:

sensing data stored in the first and third memory cells and storing the sensed data in the first and third page buffers; and reading the sensed data stored in the first and third page buffers while sensing data stored in the second and fourth memory cells and storing the sensed data in the second and fourth page buffers.

2. The method of claim 1, further comprising:

simultaneously storing data to be programmed in the first through fourth memory cells in the first through fourth page buffers.

3. The method of claim 2, further comprising:

simultaneously programming the data stored in the first through fourth page buffers in the first through fourth memory cells.

4. The method of claim 1, further comprising:

receiving column addresses corresponding to the first and third memory cells prior to sensing the first and third memory cells, and thereafter receiving column addresses corresponding to the second and fourth memory cells prior to sensing the second and fourth memory cells.

5. The method of claim 1, wherein the flash memory device generates a ready signal while reading the data stored in the first and third page buffers.

6. The method of claim 5, wherein the flash memory device generates a busy signal while sensing the data stored in the second and fourth memory cells.

* * * * *